United States Patent
Heusler et al.

(10) Patent No.: US 7,620,091 B2
(45) Date of Patent: Nov. 17, 2009

(54) BROADBAND LASER LAMP WITH REDUCED SPECKLE

(75) Inventors: Gero Heusler, Aachen (DE); Holger Moench, Vaals (NL); Ad Van Den Brandt, Eindhoven (NL); Adrianus Johannes Stephanus Maria De Vaan, 'S-Hertogenbosch (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 27 days.

(21) Appl. No.: 11/915,413

(22) PCT Filed: May 16, 2006

(86) PCT No.: PCT/IB2006/051531

§ 371 (c)(1),
(2), (4) Date: Nov. 26, 2007

(87) PCT Pub. No.: WO2006/129211

PCT Pub. Date: Dec. 7, 2006

(65) Prior Publication Data

US 2008/0212639 A1    Sep. 4, 2008

(30) Foreign Application Priority Data

May 31, 2005    (EP)    .................... 05104665

(51) Int. Cl.
*H01S 3/08*    (2006.01)
(52) U.S. Cl. ..................... 372/99; 372/102
(58) Field of Classification Search ............ 372/99, 372/102
See application file for complete search history.

(56) References Cited

U.S. PATENT DOCUMENTS

| | | | |
|---|---|---|---|
| 5,434,662 A | 7/1995 | Rockwell et al. | |
| 5,534,950 A | 7/1996 | Hargis et al. | |
| 5,832,009 A | 11/1998 | Kikuchi | |
| 6,249,381 B1 * | 6/2001 | Suganuma | 359/618 |
| 6,577,429 B1 | 6/2003 | Kurtz et al. | |
| 2002/0018036 A1 | 2/2002 | Karakawa | |
| 2002/0126981 A1 | 9/2002 | Roddy et al. | |

(Continued)

FOREIGN PATENT DOCUMENTS

EP    1463337 A2    9/2004

(Continued)

OTHER PUBLICATIONS

Itoh S et al: "491-NM Zucese-ZNSE/ZNMGSSE SCH Laser Diode With a Low Operating Voltage", Japanese Journal of Applied Physics, Japan Society of Applied Physics, Tokyo, Japan, vol. 32, No. 10B, pp. L1530-1532, Oct. 15, 1993, XP000483956.

(Continued)

*Primary Examiner*—Dung T Nguyen

(57) ABSTRACT

The present invention is directed to a laser resonator emitting visible radiation with reduced speckle noise, wherein said optical resonator is formed by at least two mirrors at both ends of a visible radiation emitting lasing material, wherein that optical resonator enhances multimode operation, so that said visible radiation emitting lasing material emits a spectrally broadened visible radiation, wherein the enveloping function of said spectrally broadened visible radiation has a full width at half maximum (FWHW) within 1 nm to 15 nm.

18 Claims, 4 Drawing Sheets

U.S. PATENT DOCUMENTS

| | | | |
|---|---|---|---|
| 2002/0172251 A1 | 11/2002 | Ohtsuka et al. | |
| 2002/0196414 A1 | 12/2002 | Manni et al. | |
| 2003/0189962 A1 | 10/2003 | Harrison | |
| 2004/0101008 A1 | 5/2004 | Kurtz et al. | |
| 2006/0176478 A1* | 8/2006 | Clarke et al. | 356/301 |
| 2007/0153866 A1* | 7/2007 | Shchegrov et al. | 372/50.124 |
| 2008/0029599 A1* | 2/2008 | Tskos et al. | 235/462.01 |

FOREIGN PATENT DOCUMENTS

| | | |
|---|---|---|
| JP | 2004144794 | 5/2004 |
| JP | 2004146793 | 5/2004 |
| WO | 9520811 | 8/1995 |

OTHER PUBLICATIONS

Trisnadi J I: "Speckle Contrast Reduction in Laser Projection Displays", Proceedings of the SPIE, Bellingham, VA, US, vol. 4657, pp. 131-137, 2002, XP002329078.

Dingel B et al: "Speckle-Free Image in a Laser-Diode Microscope by Using the Optical Feedback Effect", Optics Letters, Optical Society of America, Washington, DC, US vol. 18, No. 7, pp. 549-551, Apr. 1, 1993, XP000367981.

Mroziewicz B et al: "Broad-Area Semiconductor Lasers With Diffraction-Grating Mode Control", Optical Engineering Society of Photo-Optical Instrumentation Engineers, Bellingham, VA, US, vol. 36, No. 7, pp. 2037-2044, Jul. 1997, XP000658610.

Saloma C et al: "Speckle Redution by Wavelenght and Space Diversity Using a Semiconductor Laser", Applied Optics, Optical Society of America, Washington, DC, US, vol. 29, No. 6, pp. 741-742, Feb. 20, 1990, XP000101322.

J. E. Roman and K. A. Winick: "Neodymium-Doped Glass Channel Waveguide Laser Containing an Integrated Distributed Bragg Reflector", Appl. Phys. Lett. vol. 61, No. 23, pp. 2744-2746, Dec. 7, 1992.

* cited by examiner

BROADBAND LASER LAMP WITH REDUCED SPECKLE

The invention relates to broadband laser lamps with reduced speckle, such as diode laser pumped fiber or waveguide lasers or semiconductor diode lasers and their possible use as light source for replacement of a conventional arc lamp. Broadband laser lamps of the present invention can be used as light source for projection displays as well as for various lighting applications, e.g. headlight, shop, home, accent, spot or theater lighting.

Speckle is an effect, related to the coherence of the laser light, which causes unwanted graininess in the image. Laser speckle is a serious problem, due to random interference patterns resulting from the reflection or transmission of coherent light from or through an optically rough surface. The speckle is very annoying to look at, and past attempts employed to minimize the speckle have been to disturb the phase coherency associated with each wave front, for example, by vibrating the projection screens.

US-A1 2002/00196414 discloses a laser imaging system with reduced speckle; wherein the laser imaging system includes spatially super positioned 1-D arrays or alternatively 2-D arrays of independent emitters of laser radiation, with each emitter having a spectral bandwidth $\Delta\lambda_i$ centered at some arbitrary wavelength $\lambda_{0i}$. The elements of the array are allowed, by design, to have a slightly different central wavelength, thereby creating an ensemble bandwidth $\Delta\Lambda$, which is much greater than the bandwidth $\Delta\lambda_i$ of any individual emitter in the array. The resulting increased bandwidth reduces speckle in a displayed image.

The laser imaging system with reduced speckle has the drawback that each resonator emits one wavelength only, so that a multitude of resonators is needed each emitting at a slightly shifted wavelength in order to reduce speckle. Further, an additional optic is necessary to collect a sufficient number of said slightly shifted wavelength to form a bandwidth enhanced visible radiation beam in order to reduce speckle. Thus, a laser imaging system according to US-A1 2002/00196414 does not allow a low vertical range of manufacture, a small number of components, increased robustness, improved compactness, improved visible light output and/or low costs.

There exists a long need to simplify the manufacture process of lasers with reduced speckle, in order to provide a low vertical range of manufacture, a small number of components, increased robustness, improved compactness, improved visible light output and/or low costs, in order to provide a light source which has a beam performance superior or comparable with arc lamps so that said laser can for example be used as light source having better or similar radiation performance to replace arc lamps.

It is one object of this invention to overcome the above drawbacks by providing a broadband laser with reduced speckle having a similar radiation performance to arc lamps. The broadband laser light source of the present invention is easier to produce, more compact, and more similar to arc lamps compared with lasers known in prior art.

This object is achieved in providing a waveguide laser with an optical laser resonator emitting visible radiation with reduced speckle noise, wherein said optical resonator is formed by at least one mirror or two mirrors at both ends of a visible radiation emitting lasing material, wherein that optical resonator enhances multimode operation, so that said visible radiation emitting lasing material emits a spectrally broadened visible radiation, wherein the enveloping function of said spectrally broadened visible radiation has a full width at half maximum (FWHW) within 1 nm to 15 nm.

The term "enveloping function" as used according to the present invention means a Gaussian function or a Lorentzian function that represents the individual overlapping spectrally broadened visible radiation emission spectra of at least one wave guide laser comprising an optical resonator with a lasing material that enhances multimode operation according to the present invention, see for example FIG. 7.

The Gaussian function or a Lorentzian function is defined below:

Gauss:
$$y = y_0 + \frac{A}{w\sqrt{\frac{\pi}{2}}} e^{-\frac{2(x-x_0)}{w^2}}$$

Lorentz:
$$y = y_0 + \frac{2A}{\pi} \frac{FWHM}{4(x-x_0)^2 + FWHM^2}$$

The term "optical resonator" as used in the present description can comprises one mirror and generally two mirrors at both ends of a laser radiation emitting gain material.

An optical laser resonator according to the present invention allows multimode operation and emits a spectrally broadened visible radiation of a plurality of spatially overlapping visible laser modes. The spatially overlapping visible laser modes appear as a spectrally broadened visible radiation. In order to reduce speckle it is preferred that the enveloping function of the spectrally broadened visible radiation has a full width at half maximum (FWHW) within 1 nm to 15 nm, preferably 3 nm to 12 nm and more preferred 5 nm to 10 nm.

It is preferred that the visible radiation emitting lasing material emits blue radiation in the range of 440 nm to 470 nm, green radiation in the range of 515 nm to 550 nm and red radiation in the range of 610 nm to 680 nm, wherein the spectrally broadened visible radiation emitted from the lasing material has a full width at half maximum (FWHW) within 1 nm to 15 nm, preferably 3 nm to 12 nm and more preferred 5 nm to 10 nm.

Thus, a single optical resonator according to the present invention which operates at multimode emits already a spectrally broadened visible radiation with no or reduced speckle in the projected laser image. Therefore, a broadband laser light comprising an optical resonator according to the present invention enhancing multimode operation of the lasing material is easier to produce since less construction units are needed to provide a more compact device.

However, it is preferred to combine more than one optical laser resonators according to the present invention that allows multimode operation and emits a spectrally broadened visible radiation of a plurality of spatially overlapping visible laser modes. In order to reduce speckle it is preferred that the enveloping function of the spectrally broadened visible radiation of more than one of said combined optical laser resonators have a full width at half maximum (FWHW) within 3 nm to 15 nm, preferably 4 nm to 8 nm and more preferred 5 nm to 7 nm.

The emitted spectrally broadened visible radiation can be temporally constant or temporally modulated depending on the optical resonator used according to the present invention.

An optical resonator according to the present invention which enhances multimode is for example an optical resonator that comprises at least one mirror having a dichroic coating with a reflectivity changing across its surface faced to said lasing material, preferably said dichroic coating has a reflectivity gradient. However, it can be preferred that the dichroic coating alters the maximum reflectivity along the adjacent lasing material, preferably across the cross section of the adjacent lasing material.

Preferably, a narrow band reflective coating with a gradient can be used as a resonator mirror. However, it is sufficient and most preferred that one resonator mirror only has a gradient filter and the other resonator mirror may possess an equal high reflectivity at the pertinent wavelength range. The use of said optical resonator enhances multimode operation, wherein the visible radiation emitting lasing material of said one single optical resonator emits already a spectrally broadened visible radiation with reduced speckle noise.

To achieve a spectrally broadened visible radiation in order to reduce speckle, the coating gradient of the resonator mirror is selected so that the emitting lasing material of an optical resonator according to the present invention emits a spectrally broadened visible radiation, wherein the enveloping function of said spectrally broadened visible radiation has a full width at half maximum (FWHW) within 1 nm to 15 nm.

A further preferred embodiment according to the present invention is a resonator that comprises at least one Bragg grating with a reflectivity changing along its surface faced to said adjacent lasing material. A Bragg grating useful according to the present invention has a maximum reflectivity that alters across the cross section surface area of the adjacent lasing material, so that said Bragg grating does not have parallel lines. However, it is sufficient and most preferred that one Bragg grating only has non-parallel lines whereas the other Bragg grating has parallel lines, so that the line spacing is slightly different at one end of said Bragg grating reflector surface compared to the opposite Bragg grating reflector surface.

Bragg grating reflectors and methods to produce them are generally known in the art, see J. E. Roman, K. A. Winick, Appl. Phys. Lett. 61, 2744 (1992), and is incorporated by reference.

A further preferred embodiment according to the present invention is a resonator that comprises a Fabry Perot cavity, so that the emitting lasing material of said optical resonator emits a spectrally broadened visible radiation with reduced speckle. A slight change of the optical resonator length leads to a spectrally broadened emission of the visible wavelength radiation emitted from the lasing material, wherein the enveloping function of said spectrally broadened visible radiation has a full width at half maximum (FWHW) within 1 nm to 15 nm.

Further, the wavelength maximum can be shifted using an out coupling mirror built as a Fabry Perot device. A slight alteration of the gap between the two mirrors can cause a spectrally broadened of the laser wavelength. For an out coupling mirror built as a Fabry Perot device the air film thickness of the Fabry Perot out coupling mirror can be altered in order to enhance a spectrally broadened emission of the visible wavelength radiation emitted from the lasing material of said optical resonator, so that the enveloping function of said spectrally broadened visible radiation has a full width at half maximum (FWHW) within 1 nm to 15 nm.

Fabry Perot devices are generally known in the art, see Bergmann, Schaefer, Lehrbuch der Experimentalphysik, volume 3: Optik, Walter de Gruyter Verlag.

To provide an optical resonator that enhances multimode operation at least one of the below arrangements can be made.

For example the position, refractive index and/or angle of at least one mirror of said optical resonator can be temporally altered. Preferably the position, refractive index and/or angle of at least one mirror is temporally altered at a frequency of $\geq 25$ Hz, wherein the alteration of at least one mirror preferably comprises:

a) tilting a dichroic mirror,
b) tilting a Bragg grating,
c) electro optically changing the refractive index of a Bragg grating,
d) electro optically changing the refractive index of a Fabry Perot mirror,
e) changing the distance of the Fabry Perot mirrors.

It can be preferred that the mirror is temporally altered at a frequency of $\geq 25$ Hz. However, the mirror can be temporally altered at a frequency of $\geq 50$ Hz, $\geq 75$ Hz or $\geq 100$ Hz.

The lasing material useful according to the present invention can be any suitable lasing material as known in prior. The lasing material preferably used according to the present invention emit a spectrally broadened visible radiation of a primary color selected from the group comprising of R, G and B.

The lasing material can be preferably an upconversion material, down conversion material or a visible radiation emitting material of a semiconductor laser diode.

Thus, a further aspect of the present invention is directed to a broadband laser emitting a spectrally broadened visible radiation comprising at least one laser having an optical laser resonator with a lasing material, which enhances multimode operation according to the present invention.

Laser or laser devices with an optical resonator according to the present invention for emitting a spectrally broadened visible radiation in order to reduce speckle are preferably semiconductor laser, upconversion laser or downconversion laser.

Semiconductor lasers are general known in prior art. A typical semiconductor laser is fabricated in a photolithographic technology. Typically, semiconductor lasers are fabricated from the III-V compounds, such as gallium arsenide, indium phosphide, or indium arsenide, or from II-VI and III-V compounds. Lasers based on gallium arsenide lase at wavelengths from 660-900 nm. Lasers based on indium phosphide lase in the range 1300-1550 nm. The semiconductor laser has all the general advantages and convenience of semiconductor devices: it is compact, efficient, inexpensive, rugged, and amenable to mass production. However, one of the most important features of semiconductor lasers is their high efficiency.

Semiconductor lasers and methods to produce them are generally known in the art, see R. Diehl (Ed.), High-Power Diode Lasers, Topics Appl. Phys. 78, Springer-Verlag (2000) and is incorporated by reference.

In their simplest form a semiconductor laser consists of a small rectangular slab of semiconductor material with two cleaved facets to act as mirrors, which forms the optical resonator.

According to the present invention, it is preferred that the optical resonator of the semiconductor laser enhances multimode operation, so that the visible radiation emitting lasing material of said resonator emits spectrally broadened visible radiation. The full width at half maximum of the spectrally broadened visible radiation can be temporally constant or temporally modulated.

Optical resonators, which enhances multimode operation useful for semiconductor laser according to the present invention has been already described above. The semiconductor laser with an optical resonator according to the present invention emits a spectrally broadened visible radiation, for which the enveloping function has a full width at half maximum (FWHW) within 1 nm to 15 nm.

Further, an optical resonator as described according to the present invention can be used for downconversion laser in order to reduce speckle. Downconversion laser such as Nd:YAG and ND:YVO are general known in prior art. In particular, downconversion lasers emitting in the visible range and methods to produce them are described in US 2002/0172251 and incorporated by reference.

In general, a downconversion laser device comprises a laser source, which emit a laser beam with a short wavelength and an optical resonator comprising a downconversion material. The downconversion material converts or shifts the radiation of the laser source towards longer wavelengths. With other words, a photon of higher energy is converted by the downconversion material to a photon of lower energy.

In order to provide a downconversion laser device with reduced speckle an optical resonator according to the present invention, which enhances multimode operation, is used, wherein the optical resonator comprises a downconversion material. As downconversion material any suitable downconversion material can be used.

Downconversion materials suitable used according to the present invention are laser crystals doped with $Pr^3$, $Ho^{3+}$, $Sm^{3+}$, $Eu^{3+}$, $Dy^{3+}$, $Er^{3+}$, $Tm^{3+}$ and/or $Tb^{3+}$, which have their absorption bands in the wavelength range of 380 to 420 nm. Also, downconversion materials in form of an optical fiber or optical waveguide can be suitable used, including optical fibers or waveguides having a core doped with $Pr^{3+}$, $Ho^{3+}$, $Sm^{3+}$, $Eu^{3+}$, $Dy^{3+}$, $Er^{3+}$, $Tm^{3+}$ and/or $Tb^{3+}$.

To excite the rare-earth ions it is preferred to use a laser diode. However, a GaN-based compound laser diode can be most prepared. Thus, laser diodes, which can be used to excite the downconversion material including a laser diode, that has an active layer made of one of InGaN, InGaNAs, and GaNAs materials.

The downconversion laser device with an optical resonator according to the present invention, wherein said optical resonator comprises the down conversion material, emits a spectrally broadened visible radiation, for which the enveloping function has a full width at half maximum (FWHW) within 1 nm to 15 nm.

Therefore, it is possible to realize for example a laser-diode-excited solid-state downconversion laser, wherein the solid state laser comprises an optical resonator according to the present invention, which can emit a spectrally broadened laser beam radiation, for which the enveloping function has a full width at half maximum (FWHW) within 1 nm to 15 nm, which no laser light capable of being generated by the conventional laser-diode-excited solid-state laser apparatus has.

A broadband laser device according to the present invention comprises at least one downconversion waveguide laser, downconversion fiber laser and/or down-conversion solid-state laser. Moreover, it is preferred that a broadband laser comprises a plurality of downconversion lasers with said optical laser resonators device according to the present invention, which enhances multimode operation.

Upconversion lasers are general known in prior art. A typical upconversion laser produces visible or ultraviolet wavelength radiation comprising a semiconductor laser diode producing radiation of a given wavelength typically in the infrared wavelength range, an upconversion material which converts this given wavelength radiation into light of a shorter wavelength e.g. in the visible or ultraviolet wavelength region, and an optical resonator which recirculates the visible or ultraviolet wavelength radiation.

The term "upconversion material" as used in the present description can mean a material, for example in form of a crystal, glass, optical fiber or optical waveguide that carries the in-coupled IR light and the wavelength radiation emitted by the rare earth ions by an upconversion process of photon absorption energy transfer followed by emission.

In order to provide an upconversion laser device with reduced speckle an optical resonator according to the present invention as described above, which enhances multimode operation, is used, wherein the optical resonator comprises an upconversion material. In general, any suitable upconversion material can be used.

The upconversion material, for example in form of a crystal, optical fiber or optical waveguide, may consist of a fluoride glass known as ZBLAN, consisting of the components $ZrF_4$, $BaF_2$, $LaF_3$, $AlF_3$ and NaF, doped with one or more rare earth ions from the group Er, Yb, Pr, Tm, Ho, Dy, Eu, Nd or a combination thereof. Further, the upconversion material may consist of $LiLuF_4$, $LiYF_4$, $BaY_2F_8$, $SrF_2$, $LaCl_3$, $KPb_2Cl_5$, $LaBr_3$ doped with one or more rare earth ions as above or a rare earth doped metal fluoride such as Ba-Ln-F or Ca-Ln-F, where Ln is one or more rare earth ions as above. ZBLAN materials are further described in K. Ohsawa, T. Shibita, Preparation and characterization of $ZrF_4$—$BaF_2$—$LaF_3$—NaF—$AlF_3$ glass optical fibers, Journal of Lightwave Technology LT-2 (5), 602 (1984).

The term "upconversion layer" as used in the present descriptions can mean a layer structure that consists preferably of a rare earth doped ZBLAN layer, e.g. $ZBLAN:Er^{3+}$ that carries the in-coupled IR light and the visible light emitted by the rare earth ions by an upconversion process of photon absorption energy transfer followed by emission.

The present invention describes below in more detail a broadband laser according to the present invention, in particular broadband waveguide lasers, emitting visible radiation with reduced speckle noise for an emission color, for example red, green or blue, in the projected laser image, wherein said optical resonator is formed by at least two mirrors at both ends of a visible radiation emitting lasing material, wherein that optical resonator enhances multimode operation, so that said visible radiation emitting lasing material emits a spectrally broadened visible radiation, wherein the enveloping function of said spectrally broadened visible radiation has a full width at half maximum (FWHM) within 1 nm to 15 nm.

A broadband upconversion or downconversion laser, which can be used according to the present invention comprises:

a) at least one semiconductor diode laser or laser bar or stack producing an excitation radiation;

b) at least one optical resonator according to the present invention, which recirculates the excitation radiation and enhances multimode operation;

c) at least one upconversion material that converts the excitation radiation into visible wavelengths by an upconversion process of photon absorption energy transfer followed by emission, wherein the upconversion material is arranged in said multimode optical resonator that enhances multimode operation or at least one downconversion material that converts the excitation radiation into visible wavelengths by an downconversion process of photon absorption followed by emission, wherein the downconversion material is arranged in said multimode optical resonator that enhances multimode operation.

The broadband upconversion or downconversion laser can be placed on a substrate. The substrate can be of glass material and/or ceramic and/or metal, e.g. copper, preferably the substrate is of a material with high heat conductivity to allow efficient cooling of the device. The diode laser or diode laser bar or stack and the upconversion or downconversion material can be placed on the same substrate or on separate substrates.

Further, it can be preferred that:
  the upconversion or downconversion material, referred to as conversion material, is placed between two waveguide layers of a refractive index smaller than the refractive index of the conversion material;
  the total thickness of the conversion material and the two waveguide layers is at least 1 µm thicker than the thickness of the emitting layer in the semiconductor diode laser
  the laser diode or laser diode bar and the conversion material are arranged on the same substrate or each on a separate substrate;
  the laser diode or laser diode bar and the conversion material sandwiched between an optical resonator enhances multimode operation are adjacent arranged, whereby a gap between the adjacent arranged diode laser or diode laser bar and the conversion material is formed; or
  the laser diode or laser diode bar and the conversion material sandwiched between an optical resonator enhances multimode operation are contacting arranged.

The measures described above may provide a waveguide laser with reduced speckle having a low vertical range of manufacture, a small number of components, increased robustness, improved compactness and improved visible light output.

According to a first embodiment of the present invention an IR diode laser or diode laser bar arranged on a substrate is sandwiched between one n-electrode and one p-electrode. The upconversion layer is arranged on the same substrate positioned adjacent in front of the IR diode laser or laser bar. The visible laser can be realized in the form of an intracavity or extracavity arrangement.

According to the present invention an excitation laser source can comprise at least 1, preferably at least 5, more preferably at least 10, most preferably at least 20 diode laser emitters. A laser diode bar comprises at least 5 diode laser emitters and preferably 20 diode laser emitters.

According to the present invention a laser with an optical resonator that enhances multimode operation and emits a spectrally broadened visible radiation can preferably be used, wherein said laser is excited or pumped by a single laser diode.

A further embodiment of the present invention is directed to a plurality of lasers, which each or most of these have an optical resonator that enhances multimode operation and emit a spectrally broadened visible radiation with a full width at half maximum (FWHW) within 1 nm to 15 nm, wherein said lasers can preferably be excited or pumped by at least one diode laser bar. The pump or excitation sources comprise preferably 1 to 20 emitters.

The present invention is directed further to a laser source or laser imaging system comprising a stack of more than one semiconductor diode laser bar producing excitation radiation and including spatially super positioned waveguide lasers according to the present invention of independent emitters of laser radiation, in which each or most emitters emit a spectrally broadened visible radiation.

The elements of the waveguide lasers according to the present invention are allowed, by design, to have each a slightly different spectrally broadened visible radiation with a full width at half maximum (FWHW) within 1 nm to 15 nm, thereby creating an ensemble bandwidth, wherein the enveloping function of said ensemble of spectrally broadened visible emission radiations has a full width at half maximum (FWHW) within 5 nm to 15 nm. The resulting increased bandwidth reduces speckle in a displayed image.

Thus, it can be preferred that a laser source according to the present invention can comprise a stack of more than one semiconductor diode laser bar producing excitation radiation; and comprising an upconversion material or downconversion material that converts the excitation wavelength radiation into spectrally broadened visible radiation, wherein the enveloping function of said spectrally broadened visible radiation has a full width at half maximum (FWHW) within 5 nm to 15 nm as described above.

Exemplary embodiments of the present invention will be described in the following, with reference to the following drawings.

Figure 5:
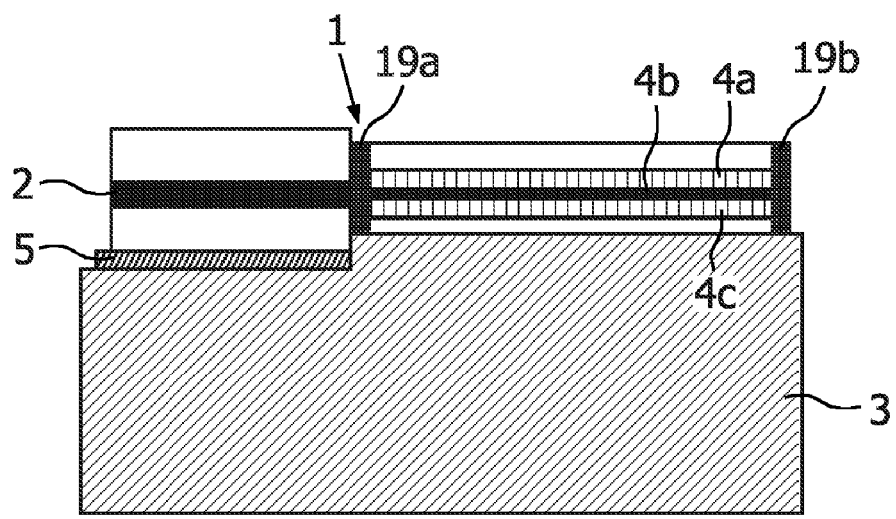
Figure 6:
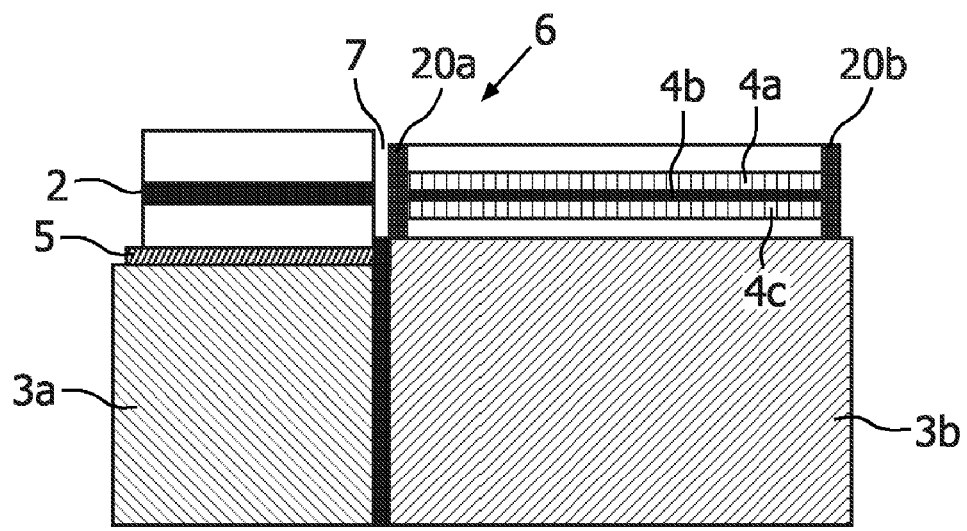
Figure 7:
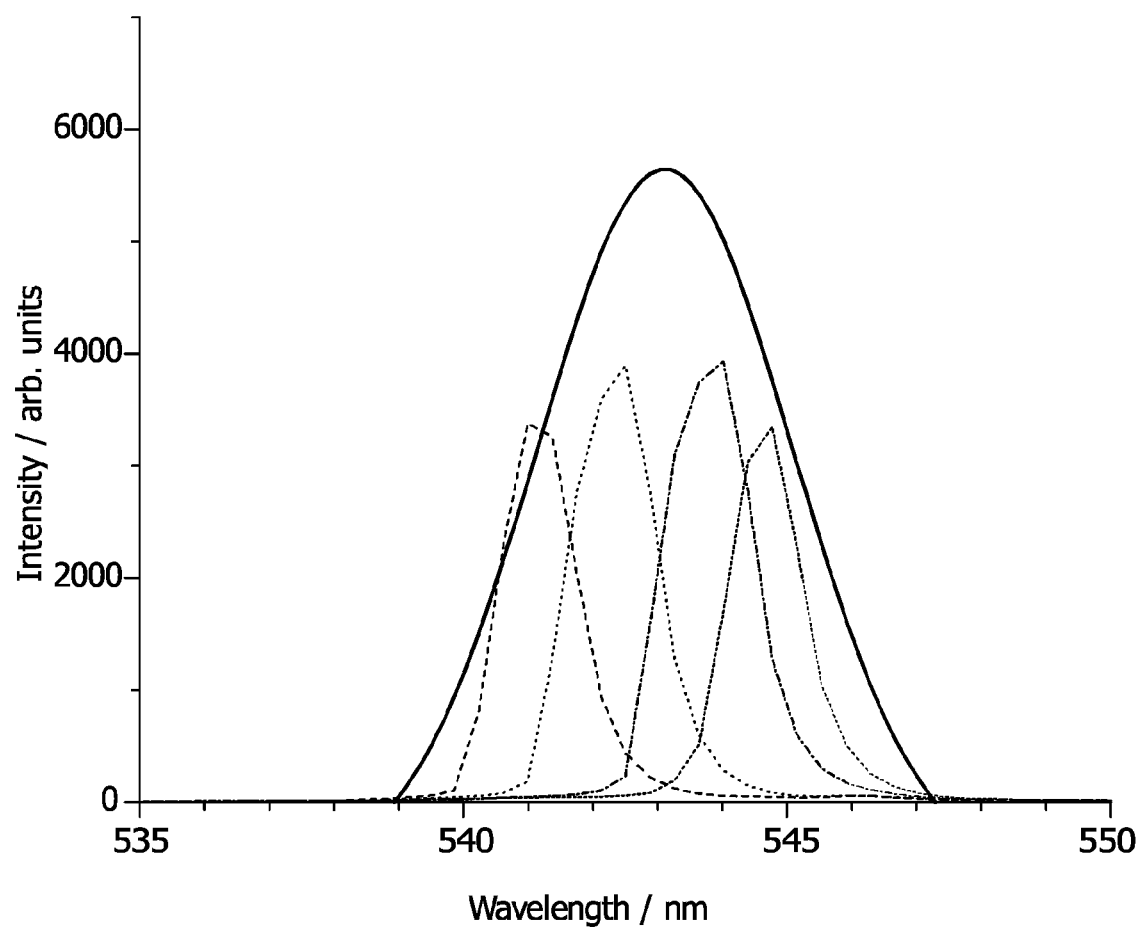

FIG. 5 shows a schematic side view of a waveguide laser located on one substrate in which the upconversion layer is placed between two waveguide layers FIG. 6 shows a schematic side view of a waveguide laser located on two substrates in which the upconversion layer is placed between two waveguide layers FIG. 7 fit of a Gaussian—solid line—to the sum of the individual overlapping laser emission spectra—non-solid lines—.

It has to be noted that according to the present invention only one waveguide laser with one laser diode can be used, which emits a spectrally broadened visible radiation according to the present invention. Thus, the figures are exemplary embodiments of the present invention.

Figure 1:
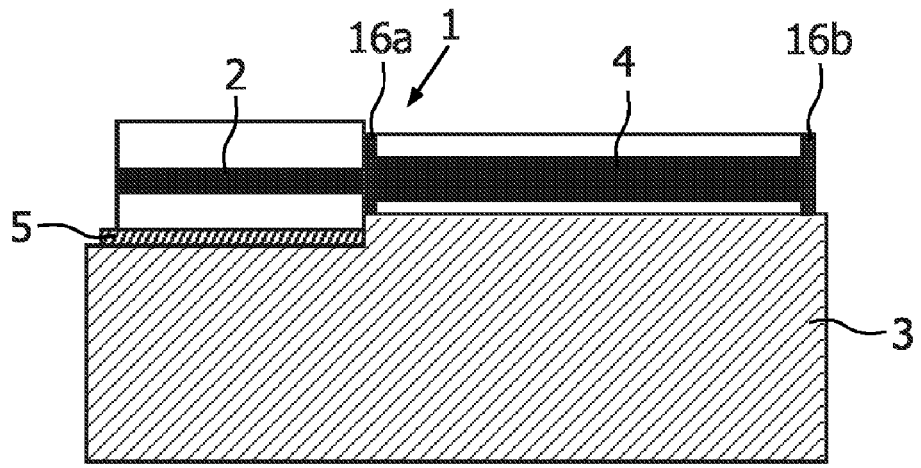
FIG. 1 shows a schematic side view of a waveguide laser located on one substrate.

FIG. 1 shows a schematic side view of a waveguide laser (1) consisting of a laser diode or laser diode bar (2) that is soldered with a soldering layer (5) to a substrate (3). On the same substrate (3) an upconversion layer (4) is placed, the upconversion layer (4) is arranged in an optical resonator (16a/16b) that enhances multimode operation, wherein the mirror (16a) has a visible radiation reflective coating and the mirror (16b) is coated with a visible radiation reflective dichroic coating having a thickness gradient. The upconversion layer is of ZBLAN:Er and placed between two layers of lower refractive index e.g. consisting of ZBLAN with a different stoichiometric composition. In this case the upconversion layer (4) emits a spectrally broadened visible radiation, wherein the enveloping function of said spectrally broadened visible radiation has a full width at half maximum (FWHW) within 1 nm to 15 nm.

Figure 2:
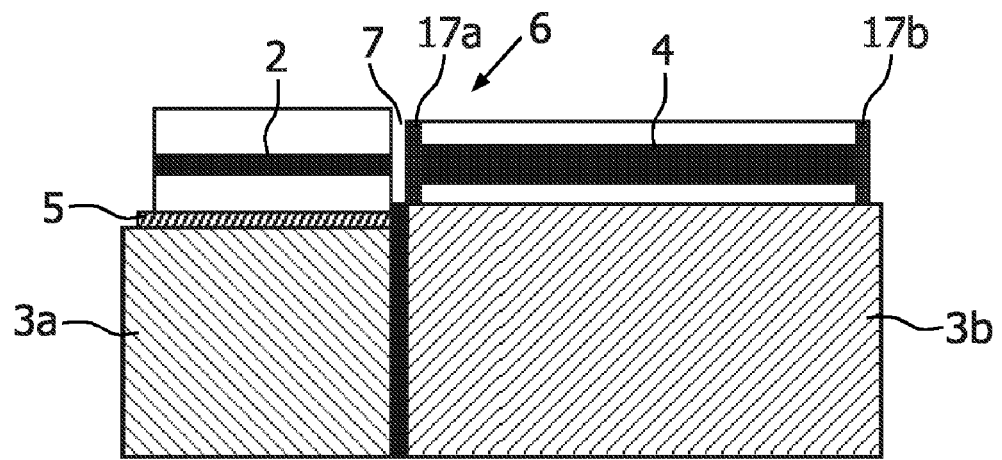
FIG. 2 shows a schematic side view of a waveguide laser located on two substrates.

FIG. 2 shows a schematic side view of a waveguide laser (6) consisting of a laser diode or laser diode bar (2) that is soldered with a soldering layer (5) to a first substrate (3a). On a separate second substrate (3b) an upconversion layer (4) of ZBLAN:Er is placed, whereby said upconversion layer is arranged between two layers of lower refractive index e.g. consisting of ZBLAN with a different stoichiometric composition. The upconversion layer (4) is arranged in an optical resonator (17a/17b) that enhances multimode operation, wherein the mirror (17a) has a visible radiation reflective coating and the mirror (17b) is a Fabry Perot out coupling mirror. This second substrate (3b) is positioned adjacent to the first substrate (3a) and between the laser diode bar (2) and the upconversion layer (4) is a gap (7) filled with a material having an index of refraction between the index of refraction of the diode laser bar (2) and the index of refraction of the upconversion layer (4). In this case the upconversion layer (4) emits a spectrally broadened visible radiation, wherein the enveloping function of said spectrally broadened visible radiation has a full width at half maximum (FWHW) within 1 nm to 15 nm.

Figure 3:
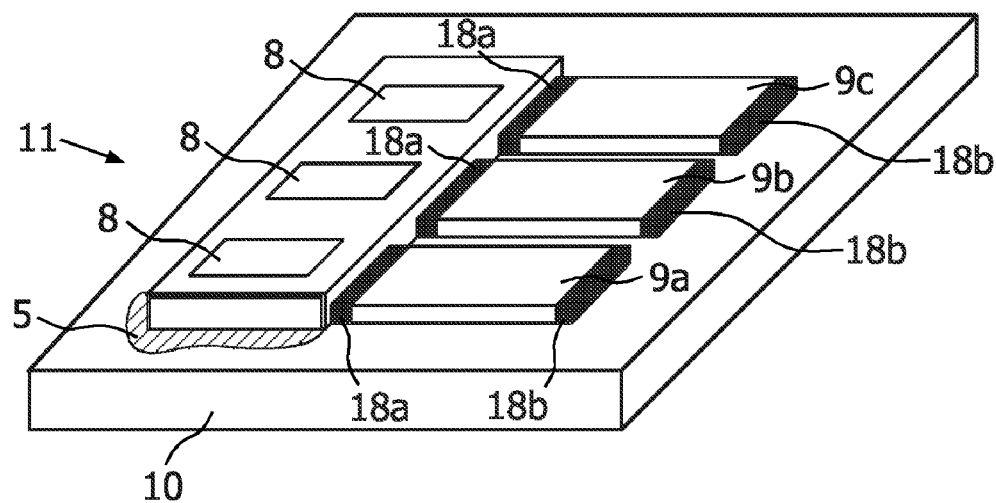
FIG. 3 shows a schematic view of a waveguide laser with a laser diode bar of three emitters and three upconversion layers located on one substrate.

FIG. 3 shows a schematic view of a waveguide laser (11) consisting in this case of a laser diode bar of three emitters (8) that is soldered with a soldering layer (5) to a substrate (10) and three upconversion layers (9a; 9b, 9c) placed in front of the emitter output facets on the same substrate (10). The upconversion layers (9a; 9b, 9c) are each arranged in an optical resonator (18a/18b) that enhances multimode operation, wherein the mirror (18a) is a Bragg grating and the mirror (18b) is Bragg grating with a different structure having non-parallel lines. In this case, the three individual upconversion lasers (9a; 9b, 9c) emit each a spectrally broadened visible radiation of red (9a), green (9b) and blue radiation (9c) of different visible radiations, wherein the enveloping function of said spectrally broadened visible radiation has a full width at half maximum (FWHW) within 1 nm to 15 nm.

Figure 4:
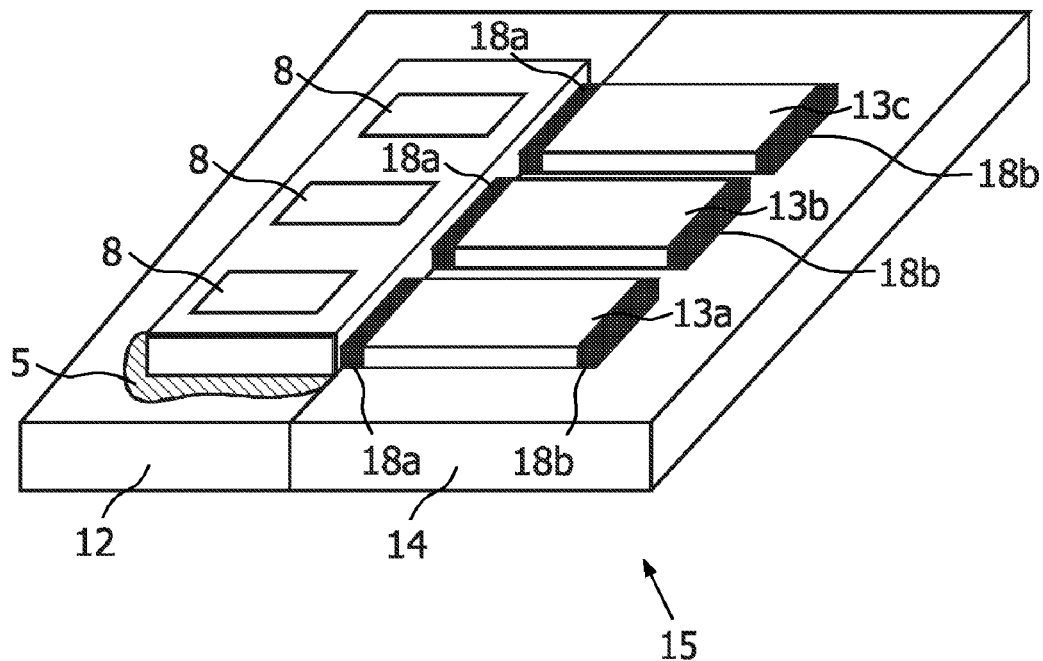
FIG. 4 shows a schematic view of a waveguide laser with a laser diode bar of three emitters and three upconversion layers located on two substrates.

FIG. 4 shows a schematic view of a waveguide laser (15) consisting of a laser diode bar of three emitters (8) soldered with a soldering layer (5) to a first substrate (12) and three upconversion layers (13a; 13b, 13c) soldered to a separate second substrate (14). The three upconversion layers (13a; 13b, 13c) soldered to said second substrate (14) are placed in front of the emitter output facets of the diode laser bar on the first substrate (12). The upconversion layers (13a; 13b, 13c) are each arranged in an optical resonator (18a/18b) that enhances multimode operation, wherein the mirror (18a) is a Bragg grating and the mirror (18b) is Bragg grating with a different structure having non-parallel lines. In this case, the three individual upconversion lasers (13a; 13b, 13c) emit each spectrally broadened visible radiation of red (13a), green (13b) and blue light (13c) of different visible radiations, wherein the enveloping function of said spectrally broadened visible radiation has a full width at half maximum (FWHW) within 1 nm to 15 nm.

FIG. 5 shows a schematic side view of a waveguide laser (1) consisting of a laser diode bar (2) that is soldered with a soldering layer (5) to a substrate (3). On the same substrate (3) an upconversion layer (4b) is placed. The upconversion layer is of ZBLAN:Er and placed between two waveguide layers (4a, 4c) of lower refractive index e.g. consisting of ZBLAN with a different stoichiometric composition. The upconversion layer (4b) and the two waveguide layers (4a, 4c) can in turn be placed between two layers of lower refractive index than the waveguide layers, e.g. consisting of ZBLAN with a stoichiometric composition differing from the upconversion layer and the waveguide layer. The upconversion layer (4b) is arranged in an optical resonator (19a/19b) that enhances multimode operation, wherein the mirror (19a) is a Bragg grating and the mirror (19b) is Bragg grating with non parallel lines, whereof the refractive index is electro optically altered at a frequency of >25 Hz. In this case the upconversion layer (4b) emit a spectrally broadened visible radiation, wherein the enveloping function of said spectrally broadened visible radiation has a full width at half maximum (FWHW) within 1 nm to 15 nm.

FIG. 6 shows a schematic side view of the waveguide laser (6) consisting of a laser diode bar (2) that is soldered with a soldering layer (5) to a first substrate (3a). On a separate second substrate (3b) an upconversion layer (4b) of ZBLAN: Er is placed, whereby said upconversion layer is arranged between two waveguide layers (4a, 4c) of lower refractive index e.g. consisting of ZBLAN with a different stoichiometric composition. The upconversion layer (4b) and the two waveguide layers (4a, 4c) can be placed in turn between two layers of lower refractive index than the waveguide layers, e.g. consisting of ZBLAN with a stoichiometric composition differing from the upconversion layer and the waveguide layer. This second substrate (3b) is positioned adjacent to the first substrate (3a) and between the laser diode bar (2) and the upconversion layer (4) is a gap (7) filled with a material having an index of refraction between the index of refraction of the diode laser bar (2) and the index of refraction of the upconversion layer (4). The upconversion layer (4b) and waveguide layer is arranged in an optical resonator (20a/20b) that enhances multimode operation, wherein the mirror (20a) is a Fabry Perot mirror and the mirror (20b) is a Fabry Perot out coupling mirror, whereof the maximum reflectivity of the Fabry Perot out coupling mirror is piezoelectrically altered at a frequency of >25 Hz. In this case the upconversion layer (4b) emit a spectrally broadened visible radiation, wherein the enveloping function of said spectrally broadened visible radiation has a full width at half maximum (FWHW) within 1 nm to 15 nm.

FIG. 7 shows the fit of a Gaussian—solid line—to the sum of the individual overlapping laser emission spectra—non-solid lines—with respect to a spectrally broadened visible radiation obtained by moving the out coupling mirror in an ZBLAN:Er fiber laser for the output laser wavelength for four different positions of the out coupling mirror, wherein the enveloping function (Gaussian function) of said spectrally broadened visible radiation has a full width at half maximum (FWHW) of about 5 nm.

Individual broadband lasers according to the present invention can be conductively contacted. For example each diode laser can be controlled separately and/or groups of diode lasers are conductively contacted such that a group of diode lasers are conjointly operated.

Broad band laser or laser devices with an optical resonator according to the present invention for emitting a spectrally broadened visible radiation in order to reduce speckle are preferably semiconductor laser, upconversion laser and/or down-conversion laser. In a preferred embodiment of the present invention a broadband laser device is provided comprising a number of laser groups with a lasing material arranged in an optical resonator that enhance multimode operation. The lasing material emit a spectrally broadened visible radiation due to the optical resonator of the present invention, so that a number of red color, green color and blue color radiation is emitted with reduced speckle. The broadband laser or laser devices can be conjointly operated each allowing a time-sequential operating of said lasers with different colors. It can be preferred to cluster a number of speckle reducing light beams of the same color or different color.

This allows for example to adapt the output power of different visible wavelength radiations, i.e. different colors, by varying the electric power of the respective excitation laser.

Further, a broadband laser device according to the present invention can also comprise individual excitation laser, such as diode lasers, used to pump upconversion materials or downconversion materials.

The broadband laser device comprising a lasing material arranged in an optical resonator that enhances multimode operation according to the present invention can be further adapted to have an optical beam quality $M^2$ for visible wavelength radiation of $\geq 2$ and $\leq 1000$.

An optical beam quality $M^2$ of a broadband laser device towards upper values is caused by the multimode operation as such. Further, an optical beam quality $M^2$ of a broadband laser device towards upper values can be increased in that the cross-section area of the lasing material is extended perpendicularly to the visible radiation emission direction.

Another object of the present invention relates to a lighting device comprising at least one laser resonator or a broadband laser lamp as described, being designed for the usage in one of the following applications:
- projection application systems,
- optical application systems,
- medical lighting application systems,
- automotive applications.

To provide a comprehensive disclosure without unduly lengthening the specification, the applicant hereby incorporates by reference each of the patents and patent applications referenced above.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A laser resonator for emitting visible radiation with reduced speckle noise, said laser resonator comprising at least one mirror at each of first and second ends of a visible radiation emitting lasing material, said laser resonator enhancing multimode operation so that said visible radiation emitting lasing material emits a spectrally broadened visible radiation, wherein the enveloping function of said spectrally broadened visible radiation has a full width at half maximum (FWHW) within 1 nm to 15 nm, wherein the resonator comprises at least one Bragg grating with a reflectivity changing along its surface facing said lasing material.

2. A device for emitting visible radiation with reduced speckle noise, said device comprising a laser resonator including at least one mirror at each of first and second ends of a visible radiation emitting lasing material, said laser resonator including spectrally broadening means for spectrally broadening visible radiation emitted by the visible radiation emitting lasing material, wherein the enveloping function of said spectrally broadened visible radiation has a full width at half maximum (FWHW) within 1 nm to 15 nm, wherein the device comprises a Fabry-Perot cavity exhibiting a plurality of different visible radiations shifted with respect to their wavelength maximum.

3. The device of claim 2, wherein the spectrally broadening means comprises at least one mirror having a dichroic coating with a reflectivity changing along its surface facing said lasing material and having a thickness gradient.

4. The device of claim 2, wherein the visible radiation emitting lasing material emits a primary color selected from the group consisting of blue radiation in the range of 440 nm to 470 nm, green radiation in the range of 515 nm to 550 nm and red radiation in the range of 610 nm to 680 nm.

5. The device according to claim 2, wherein the device comprises one of a waveguide laser, an upconversion fiber laser, an upconversion solid-state laser, a downconversion fiber laser, a downconversion solid-state laser, or a semiconductor diode laser.

6. A device for emitting visible radiation with reduced speckle noise, said device comprising a laser resonator including at least one mirror at each of first and second ends of a visible radiation emitting lasing material, said laser resonator including spectrally broadening means for spectrally broadening visible radiation emitted by the visible radiation emitting lasing material, wherein the enveloping function of said spectrally broadened visible radiation has a full width at half maximum (FWHW) within 1 nm to 15 nm, wherein the spectrally broadening means comprises means for temporally altering at least one of a position, a refractive index, and an angle of at least one mirror of the laser resonator.

7. The device of claim 6, wherein the means for temporallyaltering operates at a frequency greater than 25 Hz.

8. A device for emitting visible radiation with reduced speckle noise, said device comprising a laser resonator including at least one mirror at each of first and second ends of a visible radiation emitting lasing material, said laser resonator including spectrally broadening means for spectrally broadening visible radiation emitted by the visible radiation emitting lasing material, wherein the enveloping function of said spectrally broadened visible radiation has a full width at half maximum (FWHW) within 1 nm to 15 nm, wherein the spectrally broadening means comprises:
- a first Bragg grating having parallel lines disposed at the first end of the visible radiation emitting lasing material; and
- a second Bragg grating having non-parallel lines disposed at the second end of the visible radiation emitting lasing material.

9. The device of claim 8, wherein an index of refraction of the second Bragg grating is electro optically altered at a frequency greater than 25 Hz.

10. A device for emitting visible radiation with reduced speckle noise, said device comprising a laser resonator including at least one mirror at each of first and second ends of a visible radiation emitting lasing material, said laser resonator including spectrally broadening means for spectrally broadening visible radiation emitted by the visible radiation emitting lasing material, wherein the enveloping function of said spectrally broadened visible radiation has a full width at half maximum (FWHW) within 1 nm to 15 nm, wherein the spectrally broadening means comprises:
- a Fabry Perot mirror disposed at the first end of the visible radiation emitting lasing material; and
- a Fabry Perot out-coupling mirror disposed at the second end of the visible radiation emitting lasing material.

11. The device of claim 10, wherein a maximum reflectivity of the Fabry Perot out-coupling mirror is piezoelectrically altered at a frequency greater than 25 Hz.

12. A device comprising:
- a substrate;
- a visible radiation emitting lasing material disposed on the substrate;
- an optical resonator in which the visible radiation emitting lasing material is disposed, the optical resonator being disposed on the substrate and including spectrally broadening means for spectrally broadening visible radiation emitted by the visible radiation emitting lasing material; and
- a laser diode emitting radiation at a frequency lower than a frequency of the visible radiation emitted by the visible radiation emitting lasing material, wherein at least a portion of the laser diode's radiation is coupled to the visible radiation emitting lasing material and the visible radiation emitting lasing material converts the portion of the laser diode's radiation to the visible radiation.

13. The device of claim 12, wherein the spectrally broadening means comprises:
   a first Bragg grating having parallel lines disposed at the first end of the visible radiationemitting lasing material; and
   a second Bragg grating having non-parallel lines disposed at the second end of thevisible radiation emitting lasing material.

14. The device of claim 12, wherein the spectrally broadening means comprises:
   a Fabry Perot mirror disposed at the first end of the visible radiation emitting lasing material; and
   a Fabry Perot out-coupling mirror disposed at the second end of the visible radiation emitting lasing material.

15. The device of claim 12, further comprising a second substrate, wherein the laser diode is disposed on the second substrate, and wherein a material is disposed between the laser diode and the visible radiation emitting lasing material, the material having a refractive index that is in between a refractive index of the laser diode and a refractive index of the visible radiation emitting lasing material.

16. The device of claim 12, wherein the spectrally broadeningmeans comprises at least one mirror having a dichroic coating with a reflectivity changing along its surface facing said lasing material.

17. A device comprising:
   a substrate;
   a visible radiation emitting lasing material disposed on the substrate;
   an optical resonator in which the visible radiation emitting lasing material is disposed, the optical resonator being disposed on the substrate and including spectrally broadeningmeans for spectrally broadening visible radiation emitted by the visible radiation emitting lasing material, wherein the spectrally broadening means comprises at least one Bragg grating with a reflectivity changing along its surface facing said lasing material.

18. A device comprising:
   a substrate;
   an optical resonator in which the visible radiation emitting lasing material is disposed, the optical resonator being disposed on the substrate and including spectrally broadening means for spectrally broadening visible radiation emitted by the visible radiation emitting lasing material, wherein the optical resonator includes:
      a first mirror disposed on the substrate at a first end of the visible radiation emitting lasing material; and
      a second mirror disposed on the substrate at a second end of the visible radiation emitting lasing material opposite the first end,
      wherein the spectrally broadening means comprises means for temporally altering at least one of a position, a refractive index, and angle of at least one of the mirrors of the optical resonator.

\* \* \* \* \*